United States Patent

Kinno et al.

[11] Patent Number: 5,981,931
[45] Date of Patent: Nov. 9, 1999

[54] IMAGE PICK-UP DEVICE AND RADIATION IMAGING APPARATUS USING THE DEVICE

[75] Inventors: Akira Kinno; Norihiko Kamiura, both of Yokohama, Japan

[73] Assignee: Kabushiki Kaisha Toshiba, Kawasaki, Japan

[21] Appl. No.: 08/818,102

[22] Filed: Mar. 14, 1997

[30] Foreign Application Priority Data

Mar. 15, 1996 [JP] Japan ..................................... 8-059681
Mar. 18, 1996 [JP] Japan ..................................... 8-088754

[51] Int. Cl.$^6$ ............................ G01N 23/04; H04N 5/32; H04N 5/335
[52] U.S. Cl. .................................... 250/208.1; 250/208.6; 250/214.1; 250/370.09; 250/580; 348/308
[58] Field of Search .............................. 250/208.1, 208.2, 250/208.3, 208.6, 214.1, 214 R, 214 A, 370.09, 580, 584, 578.1; 358/482, 483, 484; 348/294, 301, 307, 308

[56] References Cited

U.S. PATENT DOCUMENTS

| | | | |
|---|---|---|---|
| 4,575,638 | 3/1986 | Okumura | 358/448 |
| 4,788,445 | 11/1988 | Hatanaka et al. | 358/482 |
| 4,916,326 | 4/1990 | Hatanaka et al. | 250/578.1 |
| 5,291,292 | 3/1994 | Hotta | 348/308 |
| 5,319,206 | 6/1994 | Lee et al. | 250/580 |
| 5,338,690 | 8/1994 | Fukaya et al. | 438/59 |
| 5,479,208 | 12/1995 | Okumura | 348/301 |
| 5,563,421 | 10/1996 | Lee et al. | 250/580 |
| 5,598,004 | 1/1997 | Powell et al. | 250/580 |
| 5,708,471 | 1/1998 | Okumura | 348/301 |

FOREIGN PATENT DOCUMENTS 6-54956  7/1994  Japan .

*Primary Examiner*—Que T. Le
*Assistant Examiner*—John R. Lee
*Attorney, Agent, or Firm*—Oblon, Spivak, McClelland, Maier & Neustadt, P.C.

[57] ABSTRACT

An image pick-up device comprises an insulating substrate, and a plurality of pixels each including a photo-electric conversion circuit, a thin-film transistor connected to the photoelectric conversion circuit and including a lamination of an insulating film and a semiconductor film, the pixels being mounted in an array on the insulating substrate. A plurality of signal lines read the voltage store in the photo-electric conversion circuit through the thin-film transistors formed on the insulating substrate. A plurality of wirings are formed on the insulating substrate. An insulating film having the same lamination as the thin-film transistor is formed between the wiring and the signal line at each crossing thereof.

8 Claims, 10 Drawing Sheets

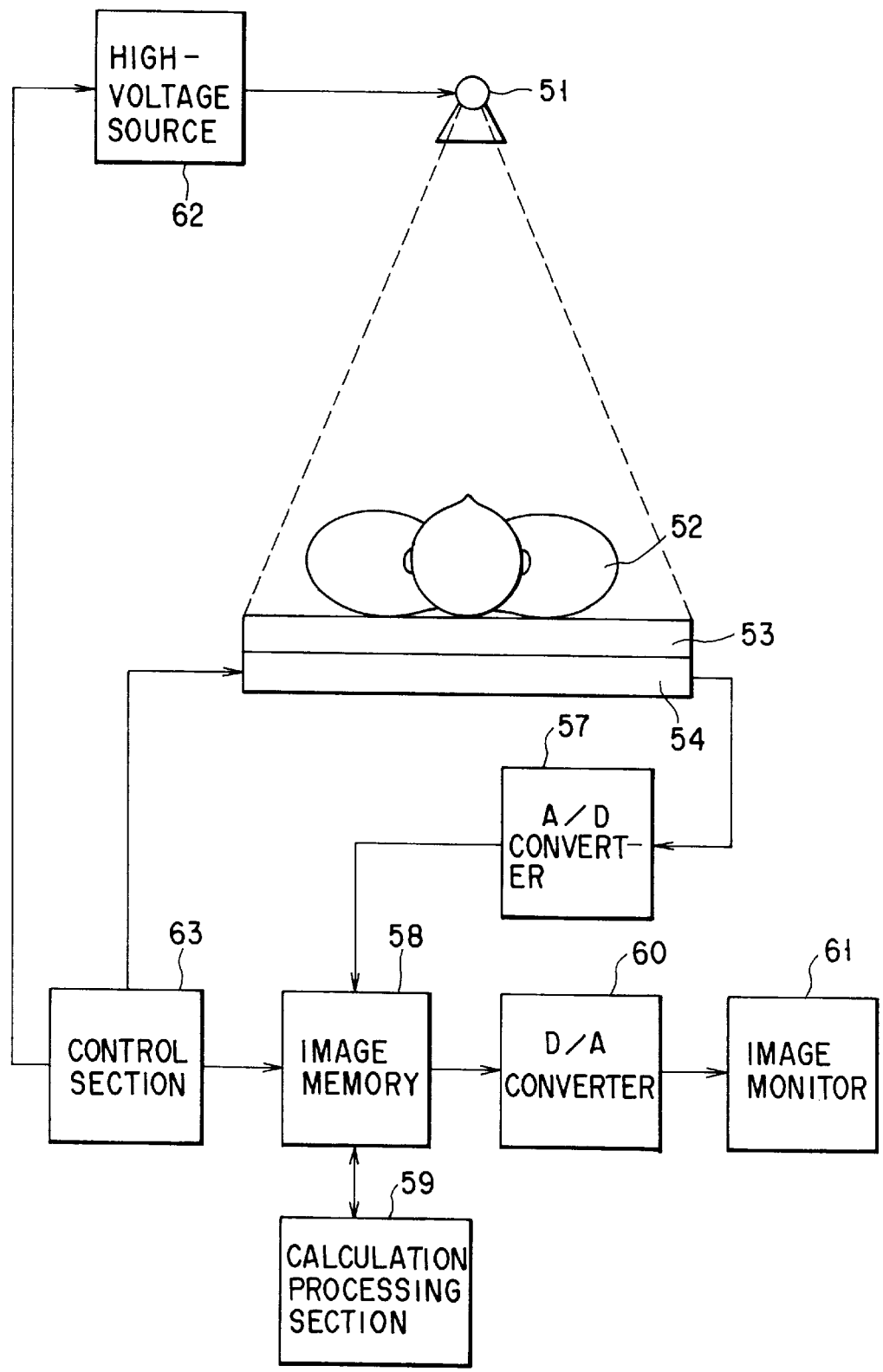
F I G. 8

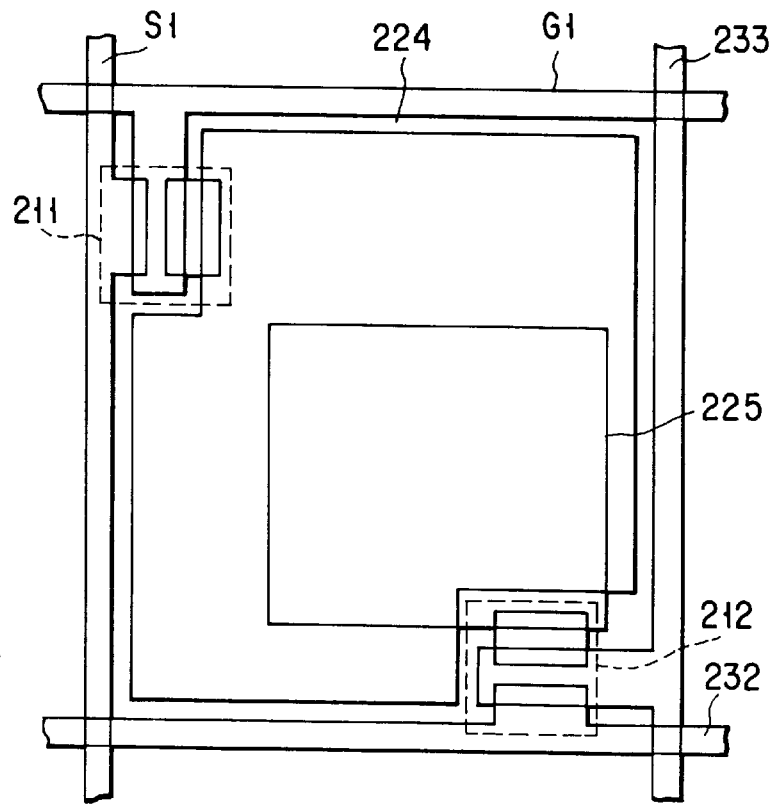
F I G. 14
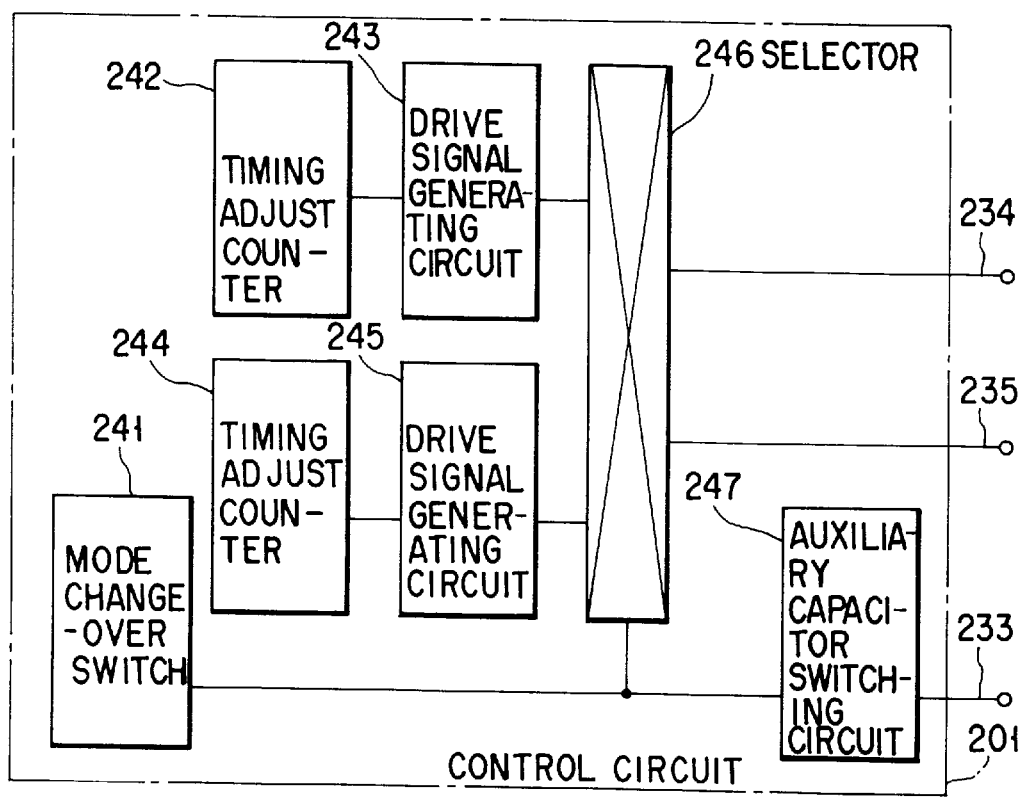
F I G. 15

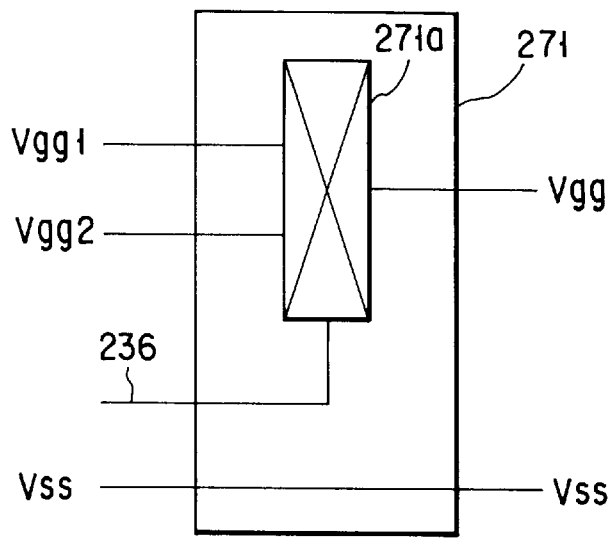
F I G. 19
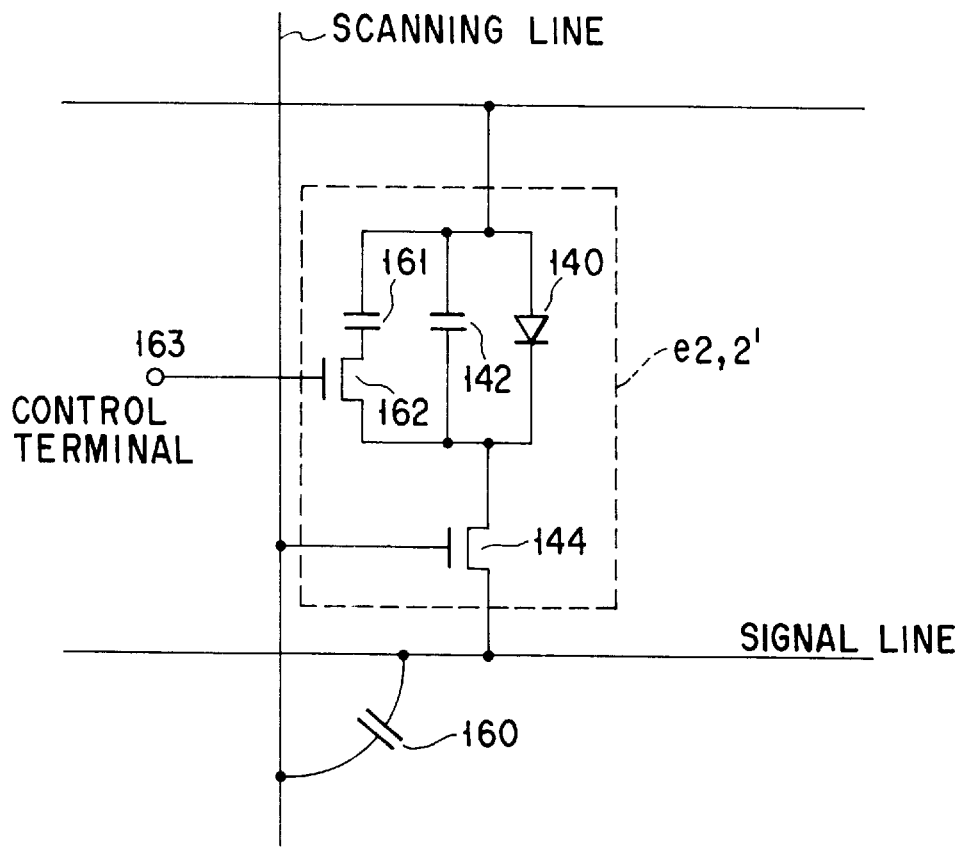
F I G. 20

IMAGE PICK-UP DEVICE AND RADIATION IMAGING APPARATUS USING THE DEVICE

BACKGROUND OF THE INVENTION

1. Field of the Invention

The present invention relates to an image pick-up device for converting an optical signal into an electrical signal and a radiation imaging apparatus using such a device.

2. Discussion of the Background

An image pick-up device using a photoelectric conversion element is widely used for such applications as a video camera and a digital camera. Also, in an X-ray imaging apparatus constituting an example of a medical radiation diagnostic apparatus, the image pick-up device has recently replaced the silver salt film. In recent years, the trend in the medial field is toward more and more medical data on patients stored in a data base for the purpose of performing medical treatment rapidly and accurately. This is in view of the fact that a patient often consults a plurality of medical institutions and an accurate medical treatment would be impossible without referring to the data stored in other medical institutions. An example is the problem of drugs prescribed by different medical institutions and the side reactions between them. It is necessary for a given medical institution to perform proper treatment taking the drugs prescribed by other medical institutions into consideration.

A demand is also high for introducing a data base of radiographic image data, and digitization of radiographic images is desired. Conventional medical radiation diagnostic apparatuses have taken a radiographic image using a silver salt film. If this film is to be digitized, after being exposed and developed, it is required to be scanned by a scanner or the like. This consumes a considerable labor and time. Recent years have seen the realization of direct digitization of an image using a CCD camera of about one inch. In such an application as taking a picture of the lung of the human being, however, the need of covering an area of about 20 cm×30 cm requires an optical system for focusing light sufficient for this size, thereby leading to the problem that a larger apparatus is required.

A method for solving the problems of these two types of systems has been suggested using a thin-film transistor such as an a-Si TFT (amorphous silicon thin-film transistor) for the radiation imaging apparatus. FIG. 1 is a diagram showing a general configuration of an image pick-up device using the a-Si TFT. In the image pick-up device shown in FIG. 1, a pixel e1,1 at an address (1,1) is configured of an a-Si TFT 144, a photo-electric conversion film 140 and a pixel capacitor 142. Pixels e of this configuration are formed in an array (hereinafter referred to as the TFT array) of 2000 by 2000. The pixel at address (2000,2000), for example, is represented by e2000,2000. Each photoelectric conversion film 140 is impressed with a bias voltage from a power supply 148. The a-Si TFT 144 is connected to a signal line 118 and a scanning line 113 and the on-off operation thereof is controlled by a scanning line drive circuit 152. Each signal line 118 has an end thereof connected to a signal detection amplifier 154 through a change-over switch 146.

With the entrance of light into the pixel, a current flows in the photoelectric conversion film (photodiode) 140, and charge is accumulated in a photoelectric conversion circuit including the photoelectric conversion film and the pixel capacitor 142. The scanning line drive circuit 152 drives a scanning line 113. When all the TFTs connected to one scanning line 113 are turned on, the charge stored in the associated photoelectric conversion circuits is transferred to the amplifier 154 through the corresponding signal line 118. The change-over switch 146 is used to apply the charge for each pixel to the amplifier 154 thereby to convert it into a dot sequence signal that can be displayed on a display unit such as a liquid crystal display. The charge amount is dependent on the amount of the light entering the pixel, so that the output amplitude of the amplifier 154 undergoes variations.

In the system using the image pick-up device shown in FIG. 1, the output signal of the amplifier 154 is A/D converted thereby to produce a digital image directly.

If the image pick-up device using the TFT as mentioned above is to be applied for medical treatment, however, several problems are required to be solved. First, a higher image quality is required. Especially, the problem is how to reduce noises. Unless a clear image free of noises is obtained, an image pick-up device is useless for medical applications. The charge stored in the pixels is transferred to the amplifier 154, which generally has a high input resistance. The output of the amplifier 154, therefore, is affected even by a small disturbance, causing the deterioration of the image quality.

A cause of the disturbance is the noises derived from the scanning lines 113. Each signal line 118 forms a capacitance by crossing the scanning line 113 through an insulating layer. With the variations in source potential of the scanning line drive circuit 152, the capacitance at the crossing of the scanning line 113 and the signal line 118 is charged, and the resulting charge is also transferred to the amplifier 154. Although the description above refers to the case where a crossing capacitance is formed by crossing between the signal line 118 and the scanning line, the signal line 118 may cross wirings other than the scanning line to form a crossing capacitance.

FIG. 2 is a diagram schematically showing the crossing between the scanning line 113 and the signal line 118. FIG. 3 is a sectional view of the crossing between the scanning line 113 and the signal line 118 shown in FIG. 2. The scanning line 113 configured of a metal like MoTa or MoW, for example, is formed on a glass substrate 111, on which a gate insulating film 115 made of $SiO_x$ or $SiO_x$ is formed. The signal line 118 and the scanning line 113 are formed by being insulated from each other by the gate insulating film 115.

Assume that both the scanning line 113 and the signal line 118 have a width of 10 $\mu$m (with the crossing area S of 100 $\mu m^2$), the gate insulating film has a thickness d of 0.3 $\mu$m and has a dielectric constant $\mu$ of 5. The capacitance C at the crossing is given as $$C = \epsilon s/d = (5 \times 8.854 \times 10^{-12}) \times (10 \times 10^{-16})^2/(0.3 \times 10^{-6}) = 14.8 \, fF \quad (1)$$

In the case where there are 1000 scanning lines, each signal line 118 has a crossing capacitance of 14.8 pF. As a result, a 1-mV fluctuation of the source potential of the scanning line drive circuit would generate a charge of 14.8 fC in the amplifier 154. The charge stored in the pixel is substantially in the same order of magnitude (several tens of 10 fC to several pC). Therefore, the charge from each crossing between the scanning line 113 and the signal line 118 is a great cause of image quality deterioration.

Especially, a medical image pick-up device which requires a high dynamic range encounters the problem that the dynamic range must be sacrificed to accommodate the effect of the noises. Also, the conventional radiation image pick-up device poses the problem that an increased radiation dosage is required to produce a clear image. This gives rise to a serious problem of an increased exposure of patients to radioactivity.

An image pick-up device using the TFT array, on the other hand, has the problem of a read error and the leak current in addition to a deterioration of image quality described above. Specifically, in the image pick-up device using the TFT array described above, an image signal is produced by sequentially reading out the charge stored in each pixel, and the read characteristics vary minutely from one pixel position to another in the read operation. More specifically, in the case where the charge stored in the pixels is read out, the required read time (drive time) is determined by the on-resistance of the TFT used for switching and the time constant of the pixel capacitor. If the read time is short for the time constant, the charge stored in the pixel cannot be sufficiently read out, thereby causing an error (noise) of the stored charge and the read signal. This read error is one of the noises unique to the TFT array.

The leak current which is another noise unique to the TFT array is a phenomenon in which a minute current flows when the TFT is off. This noise stems from the insufficient off-resistance of the TFT. In such a case, the charge held in the pixel flows out so that the stored charge cannot be rightly read out, leading to an error (noise).

As described above, the two noises unique to the TFT array include the read error and the leak current. The large problem in eliminating these noises is the trade-off between the two types of errors. Specifically, the longer the read time, the smaller the read error. With the increase in the length of the read time (i.e., with the increase in the off-time), however, the error due to the leak current increases.

These errors are also affected by the ratio between the channel width and the channel length (W/L) of the TFT. In other words, a larger W/L ratio decreases the on/off resistance. The read error, therefore, decreases at the expense of a larger leak current.

Consequently, designing a TFT is crucial in a manner to minimize the two errors including the read error and the leak current.

The radiation diagnostic apparatus is used in two modes including radiography (still image) for taking a radiographic picture and fluorography (animation) for checking the condition of the affected part. The radiograhy taking one picture requires about one second of drive time, while the fluorography requires repetitive drives of about one-thirtieth of a second each. Therefore, the optimum TFT varies between the two modes. If the TFT is optimized only for one of the modes, therefore, the error is increased for the other mode to such an extent as to deteriorate the characteristics resulting in the loss of the practical value of the diagnostic apparatus.

For the reasons described above, an image pick-up device configured of the same TFT array has been difficult to use for both the radiography and the fluorography having different drive times.

In another conventional method, two types of arrays, one for radiography and the other for fluorography, are provided to switch between them according to the prevailing mode. This method, however, increases the system cost and contradicts the demand for a smaller size and a lighter weight.

SUMMARY OF THE INVENTION

Accordingly, a first object of the present invention is to provide an image pick-up device and a radiation imaging apparatus that can present a clear image with small noises.

A second object of the invention is to provide an image pick-up device and a radiation imaging apparatus having a large dynamic range.

A third object of the invention is to provide an image pick-up device and a radiation imaging apparatus which can produce a clear image without increasing radiation dosage even in the case of radiographic applications.

A fourth object of the invention is to provide an image pick-up device and a radiation imaging apparatus which can be reduced in size and weight, can meet the double mode requirements of radiography and fluorography, and at the same time reduce the error (noises) which otherwise might cause the deterioration of the image quality.

According to one aspect of the invention, there is provided an image pick-up device comprising a plurality of photoelectric conversion circuits and a plurality of thin-film transistors connected respectively to the photoelectric conversion circuits mounted in an array on an insulating substrate, a plurality of signal lines for reading out the voltage stored in the photoelectric conversion circuits through the thin-film transistors and a plurality of wirings including scanning lines crossing the signal lines for driving the thin-film transistors, wherein the wirings (typically, the scanning lines) and the signal lines are arranged in such a manner that the capacitance formed at each of the crossings thereof is regulated to assume a value smaller than the minimum value in the range of the capacitance stored in the corresponding photoelectric conversion circuit.

According to a second aspect of the invention, there is provided an image pick-up device comprising a plurality of photoelectric conversion circuits and a plurality of thin-film transistors connected respectively to the photoelectric conversion circuits mounted in an array on an insulating substrate, a plurality of signal lines for reading out the voltage stored in the photoelectric conversion circuits through the thin-film transistors, and a plurality of wirings including the scanning lines formed to cross the signal lines for driving the thin-film transistors, wherein the wirings (typically, the scanning lines) and the signal lines are arranged in such a manner that the capacitance formed at the crossings is regulated to assume a value smaller than $10^{-14}$ F.

According to a third aspect of the invention, there is provided an image pick-up device comprising a plurality of photoelectric conversion circuits and a plurality of thin-film transistors connected respectively to the photoelectric conversion circuits formed in an array on an insulating substrate, wherein a plurality of wirings including a plurality of signal lines for reading out the voltage applied to the photoelectric conversion circuits through the thin-film transistors and a plurality of scanning lines for driving the thin-film transistors are arranged in such a manner that the capacitance formed at each of the crossings thereof is regulated to assume a value smaller than the minimum value in the range of the capacitance stored in the photoelectric conversion circuit.

According to a fourth aspect of the invention, there is provided an image pick-up device comprising a plurality of photoelectric conversion circuits, a plurality of thin-film transistors connected respectively to the photoelectric conversion circuits formed in an array on an insulating substrate, wherein a plurality of wirings including a plurality of signal lines for reading out the voltage applied to the photoelectric conversion circuits through the thin-film transistors and a plurality of scanning lines for driving the thin-film transistors are arranged in such a manner that the capacitance formed at each of the crossings is regulated to assume a value smaller than $10^{-14}$ F (Farad).

According to a fifth aspect of the invention, there is provided an image pick-up device comprising a plurality of photoelectric conversion circuits, a plurality of thin-film transistors each including an insulating film and a semiconductor laminated film connected respectively to the photoelectric conversion circuits, formed in an array on an insulating substrate, a plurality of wirings such as scanning lines for driving the thin-film Transistors, a plurality of signal lines for reading out the voltage stored in the photoelectric conversion circuits through the thin-film transistors formed on the insulating substrate, and a plurality of second insulating films each configured of the same laminated film as that of the thin-film transistors and formed between each of the wirings (typically, the scanning lines) and each of the signal lines at each crossing between the wiring and the signal line.

According to a sixth aspect of the invention, there is provided an image pick-up device comprising a plurality of photoelectric conversion circuits, a plurality of thin-film transistors each including a lamination of an insulating film and a semiconductor film connected respectively to the photoelectric conversion circuits, formed in an array on an insulating substrate, a plurality of signal lines for reading out the voltage stored in the photoelectric conversion circuits through the thin-film transistors formed on the insulating substrate, and a plurality of wirings each having a portion of a first width and a portion of a second width smaller than the first width formed at the crossing with the signal line for driving the thin-film transistors.

According to a seventh aspect of the invention, there is provided a method of fabricating an image pick-up device, comprising the steps of forming a first conductive film in a first region, a second region and a third region of an insulating substrate, forming a first insulating film on the insulating substrate from above the first conductive film, forming a semiconductor film in the first region and in the second region, forming a photodiode in the third region, and forming a second conductive film in the first region.

According to an eighth aspect of the invention, there is provided an image pick-up device comprising a plurality of pixel electrodes each formed of a photoelectric conversion film layer, a plurality of signal lines arranged between the pixel electrodes, a plurality of scanning lines arranged between the pixel electrodes, a plurality of thin-film transistors (TFT) each arranged between a corresponding one of the pixel electrodes and a corresponding one of the signal lines and adapted to be turned on and off by the scanning line, a signal read circuit for reading the potential of the pixel electrodes, and a scanning line drive circuit for driving the scanning lines, wherein the crossing between each signal line and a corresponding one of the scanning lines has a thicker insulating layer than the other portions.

The portion of the insulating layer at the crossing of the signal line and the wiring may be formed of a gate insulating film of a thin-film transistor made of $SiO_X$ or $SiO_X$, a semiconductor film of a thin-film transistor made of an a-Si film, or a laminated insulating film constituting an etching stopper for the thin film transistor made of a $SiO_X$ film.

Also, the portion of the insulating film at the crossing of the signal line and the wiring may be formed of an a-Si semiconductor film of a thin-film transistor, or a lamination off insulating films constituting an etching stopper for the thin-film transistor made of a $SiO_X$ film.

According to a ninth aspect of the invention, there is provided an image pick-up device comprising a plurality of pixel electrodes including photoelectric conversion films respectively, a plurality of signal lines arranged between the pixel electrodes, a plurality of scanning lines arranged between the pixel electrodes, a plurality of thin-film transistors (TFT) each arranged between the corresponding one of the pixel electrodes and the corresponding one of the signal lines and adapted to be turned on and off by the scanning line, and a signal read circuit for reading the potential of each pixel electrode, wherein the width of the portion of the wirings including the scanning lines other than the crossing with the signal lines is Wg and the width of the wirings including the scanning lines at the crossing with the signal lines is $n \times Wg$ $(0 < n \leq 1)$.

The photoelectric conversion element constituting the photoelectric conversion circuit is used in accordance with the wavelength of the received light, and may be combined with a phosphor material.

In other words, according to the invention, there is provided an image pick-up device having a smaller charge (capacitance) formed at each crossing between the wiring such as the scanning line and the signal line in order to reduce the noise attributable to the crossing and to produce a clear image.

For this purpose, according to the invention, the wirings such as the scanning lines and the signal lines are arranged in such a manner that the capacitance formed at the crossing thereof is smaller than the capacitance stored in the photoelectric conversion circuit including the photoelectric conversion element and the storage capacitor.

Conventionally, the capacitance formed at each crossing of the wiring such as the scanning line and the signal line is on the same order of magnitude as the capacitance stored in the photoelectric conversion circuit, and therefore noises are generated from the capacitance at the crossing. In an image pick-up device according to the invention, in contrast, the crossing capacitance is reduced by one half due to the abovementioned configuration.

In the image pick-up device according to the invention, the thickness and the dielectric constant of the insulating film for insulating the signal line and the scanning line are appropriately regulated in order to reduce the crossing capacitance, and so is the area of the crossing between the signal line and the wiring such as the scanning line. Further, the aforementioned two means may be combined to reduce the crossing capacitance.

Also, the image pick-up device according to the invention uses a semiconductor film and an insulating film making up a thin-film transistor as the insulating film for insulating the signal line and the wirings such as the scanning line.

In the case of an a-Si thin-film transistor of a reverse staggered structure, for example, a gate electrode, a gate insulating film, an a-Si semiconductor film and an etching stopper (insulating protective film) are formed on an insulating substrate, on which a source-drain electrode is formed. As a result, if the gate insulating film, the a-Si semiconductor film and the etching stopper are formed at the crossing of the scanning line and the signal line, the thickness of the insulating film for insulating the wirings such as the scanning line and the signal line is increased and, even after allowing for the dielectric constant, the crossing capacitance is remarkably reduced.

All or a part of the insulating films configuring the thin-film transistor may be formed at the crossing. For example, a gate insulating film and a semiconductor film may form the insulating film at the crossing, or a gate insulating film, a semiconductor film and an etching stopper may be the components of the insulating film formed at the crossing. As another alternative, a semiconductor film making up a photodiode may be used.

The width of the wirings such as the scanning line or the signal line may be reduced at the crossing between the wirings such as the scanning line and the signal line. The crossing capacitance can be reduced also in this manner. The result is that the effect of noises on the picked-up image can be considerably reduced.

Also, the thickness and the dielectric constant of the insulating film at the crossing can be regulated while at the same time reducing the width of the scanning line or the signal line.

As described above, in the image pick-up device according to the invention, wirings such as the scanning line and the signal line are arranged with the thickness and the dielectric constant of the insulating film regulated appropriately. Also, the area of the crossing between the signal line and the wirings such as the scanning line is regulated in arranging them. Thus, the capacitance of the crossing can be reduced and so is the effect of the noises from the power supply of the scanning line drive circuit.

In a medical or the like applications of the image pick-up device according to the invention requiring a high dynamic range, therefore, a clear image free of noises can be produced.

A method of fabricating an image pick-up device according to the invention uses a film forming a photoelectric conversion circuit or a thin-film transistor at the crossing between the wirings such as the scanning line and the signal line. Therefore, the image pick-up device described above can be fabricated without increasing the number of manufacturing steps.

A method of fabricating an image pick-up device according to the invention, roughly speaking, comprises the steps of forming a scanning line in a first region, forming a signal line in a second region where a thin-transistor is to be formed and forming an auxiliary electrode in a third region where a photoelectric conversion circuit is to be formed. These films may be formed at the same time.

A gate insulating film is formed on the conductive film formed in the first region, the second region and the third region.

Then, an a-Si semiconductor film is formed in the first and second regions, and a photodiode mainly made of an a-Si semiconductor film is formed in the third region.

Further, an etching stopper is formed in the first and second regions.

By forming a signal line on these layers crosswise in the first region, the crossing structure of an image pick-up device according to the invention is formed as described above.

In the image pick-up device according to the invention, the wirings such as the scanning line and the signal line are arranged by regulating the thickness and the dielectric constant of the insulating film for insulating the wirings such as the scanning line and the signal line, and also by regulating the area of the crossing between the signal line and the wirings such as the scanning line. As a result, the capacitance at the crossing is reduced and so is the effect of noises from the power supply for the scanning drive circuit.

Consequently, in an application of the image pick-up device according to the invention requiring a high dynamic range such as in the medical field, a clear, noise-free image can be produced.

A method of fabricating an image pick-up device according to the invention uses a film for forming a photoelectric conversion circuit or a thin-film transistor at the crossing between the scanning line and the signal line, so that the above-mentioned image pick-up device is fabricated without increasing the number of fabrication steps.

Although the foregoing description relates to the case in which the signal line and the scanning line cross each other, the invention is not limited to such a case but can find an application also in the case in which the signal line crosses the wiring other than the scanning line thereby to form a crossing capacitance the same way as if the signal line crosses the scanning line.

The present invention may also be configured in the following way. An image pick-up device constitutes a photodetector comprising an array of pixels each including a photoelectric conversion film, a pixel capacitor and a switching thin-film transistor for reading the charge stored in the pixel capacitor, the image pick-up device further comprising means for switching the time constant of each pixel.

Also, there is provided an image pick-up device constituting a photodetector comprising a plurality of pixel electrodes made of photoelectric conversion films for converting an incident light into an electrical signal corresponding to the amount of the incident light, each pixel including a pixel capacitor for storing the output of the photoelectric conversion film and a thin-film transistor for reading the charge stored in the pixel capacitor, each thin-film transistor being switched to sequentially read the charge stored in each pixel capacitor thereby to produce an image signal, the image pick-up device further comprising an auxiliary capacitor for switching the time constant of each pixel and a switch for controlling the circuit connection of the auxiliary capacitor with the pixel capacitor, a means for controlling the connection and disconnection of the auxiliary capacitor in accordance with the signal read time of each pixel by controlling the switch, thereby controlling the time constant for reading the charge stored in each pixel capacitor through the thin-film transistor.

Further, there is provided an image pick-up device constituting a photodetector comprising a plurality of pixel electrodes each made of a photoelectric conversion film for converting the incident light into a corresponding electric signal, each pixel including a pixel capacitor for storing the output of the photoelectric conversion film and a thin-film transistor for reading the charge stored in the pixel capacitor, each thin-film transistor being controlled by switching a drive signal for sequentially reading the charge stored in each pixel capacitor thereby to produce an image signal, the image pick-up device further comprising means for selecting the level of the drive signal in accordance with the signal read time for each pixel using at least two types of drive signals of different levels for driving the thin-film transistor.

Provision of the means for changing the time constant as described above makes it possible to minimize the read error and the leak current unique to the TFT array by changing the time constant even in the case where two different drive times are used for radiography and fluorography as in an application to the radiation diagnostic apparatus. The diagnostic error which otherwise might be caused by an error (noise) can be prevented, for example, in an application to a medical imaging apparatus.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention, in which

FIG. 8 is a block diagram schematically showing a radiation imaging apparatus to which the image pick-up device according to the invention is applicable;

FIG. 14 is a plan view of a pixel in a TFT array according to a third embodiment of the invention;

FIG. 15 is a diagram showing an example of a control circuit of a system according to the invention;

FIG. 19 is a diagram showing an example of a potential control circuit of a system according to the invention; and FIG. 20 is a circuit diagram showing the essential parts of an image pick-up device according to a fifth embodiment of the invention.

DETAILED DESCRIPTION OF THE INVENTION (Embodiment 1)

Figure 1:
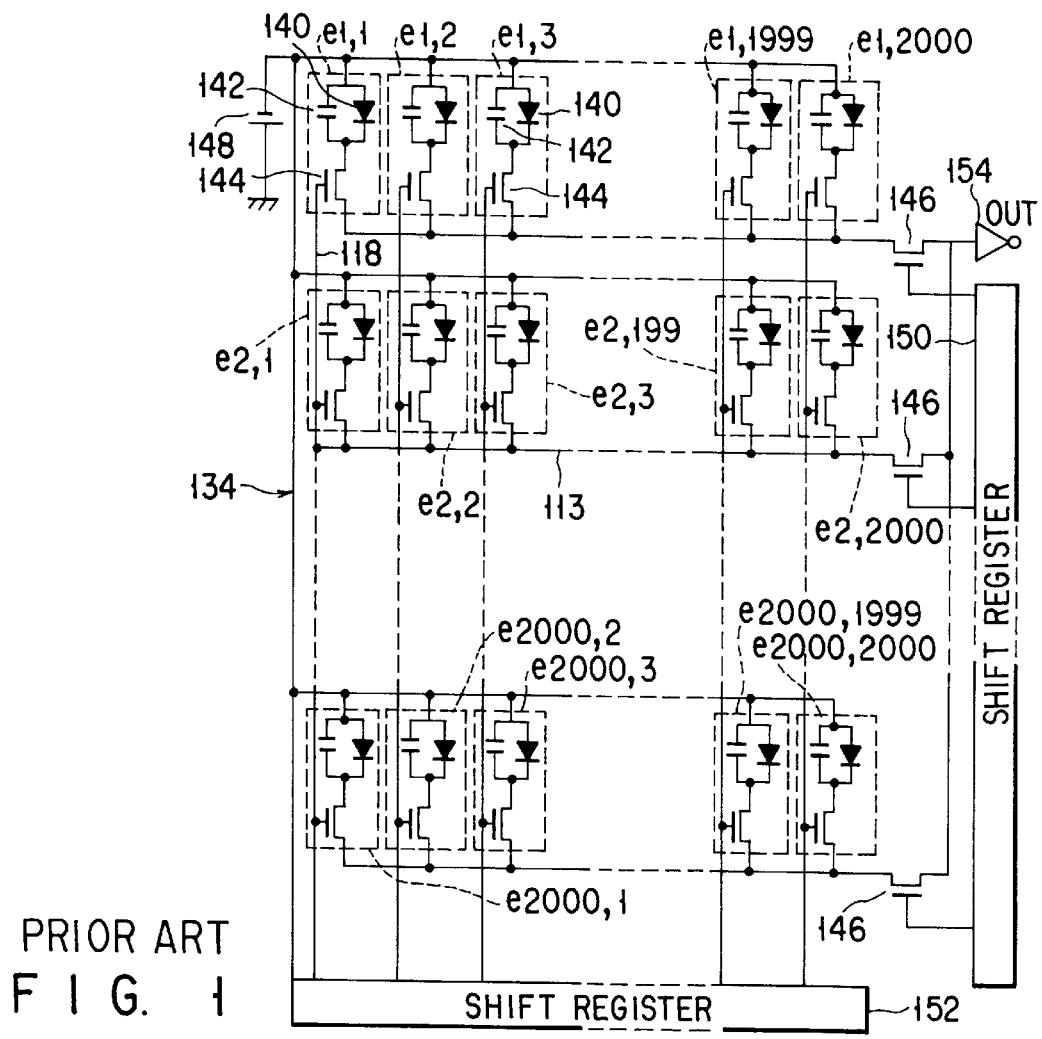
FIG. 1 is a diagram schematically showing a configuration of a conventional image pick-up device.
Figure 2:
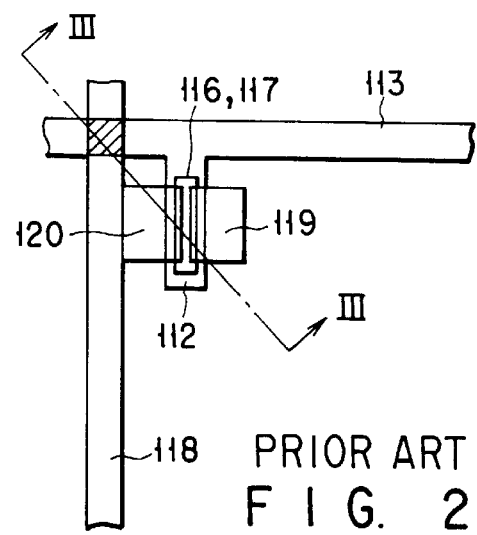
FIG. 2 is a diagram schematically showing a crossing of the signal line and the scanning line of a conventional image pick-up device.
Figure 3:
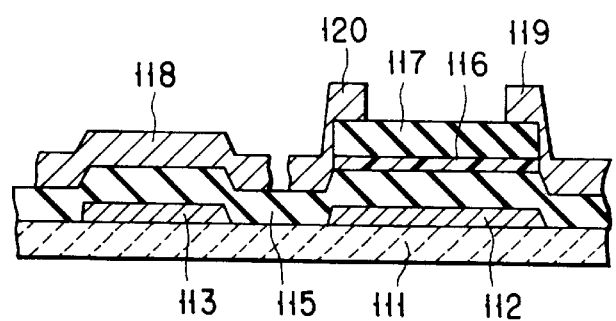
FIG. 3 is a sectional view taken in line III—III in FIG. 2.
Figure 4:
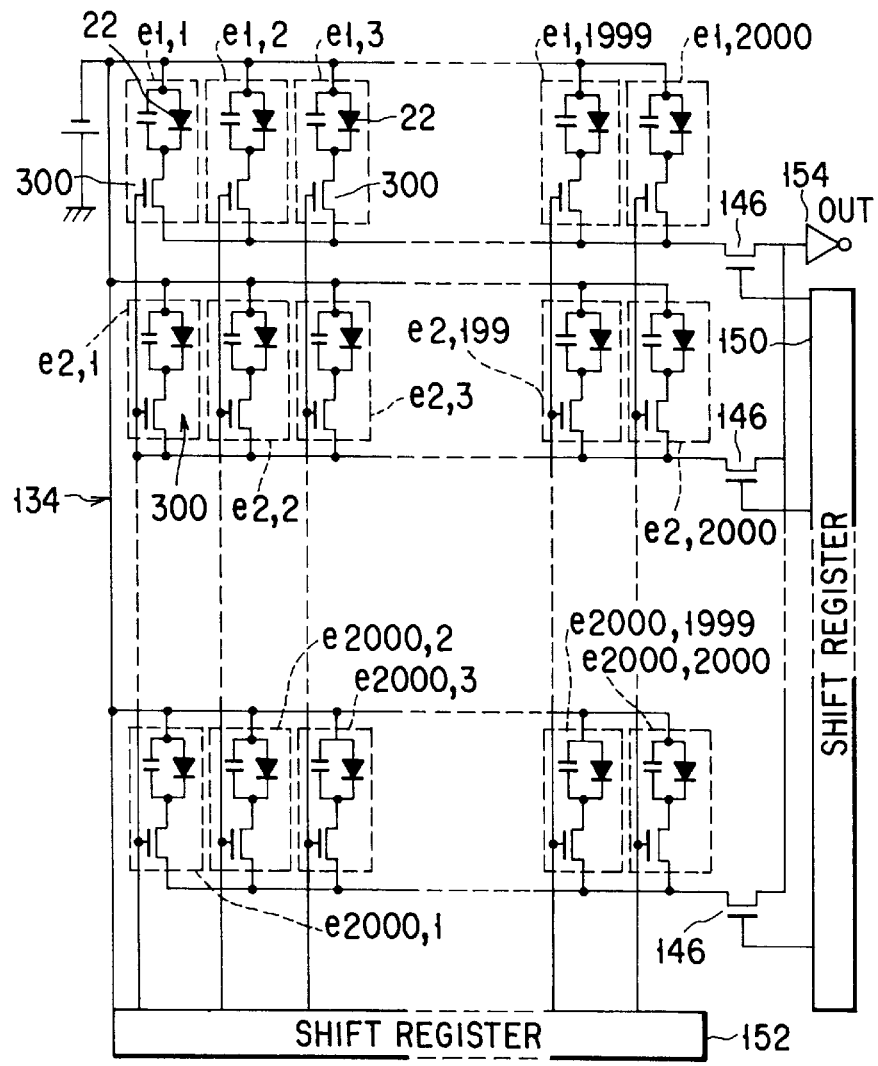
FIG. 4 is a diagram schematically showing an example configuration of an image pick-up device according to the present invention.
Figure 5:
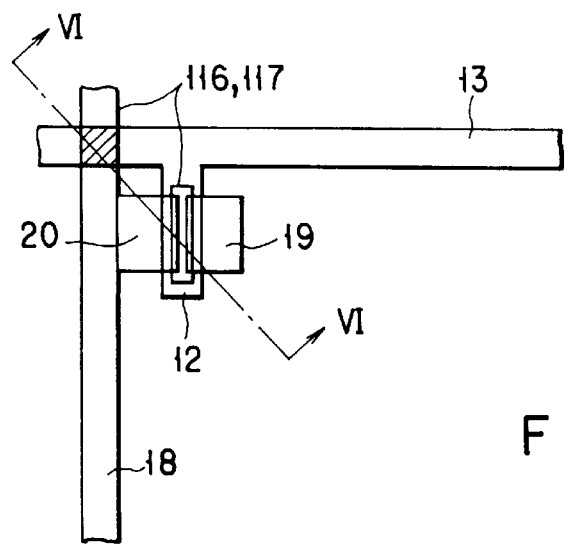
FIG. 5 is a diagram showing in an enlarged form the crossing and the scanning line of an image pick-up device according to the invention.

An image pick-up device according to the first embodiment of the invention is shown schematically in FIG. 4. With reference to FIG. 5, the crossing of the signal line and the wirings such as the scanning line of an image pick-up device according to the invention illustrated in FIG. 4 will be more specifically understood. Also, with reference to FIG. 6, the sectional structure of an image pick-up device according to the invention can be understood. Further, with reference to FIG. 7, the fabrication steps of an image pick-up device according to the invention can be understood. Also, with reference to FIG. 8, an example of the radiation diagnostic apparatus using an image pick-up device according to the invention can be understood.

Figure 7:
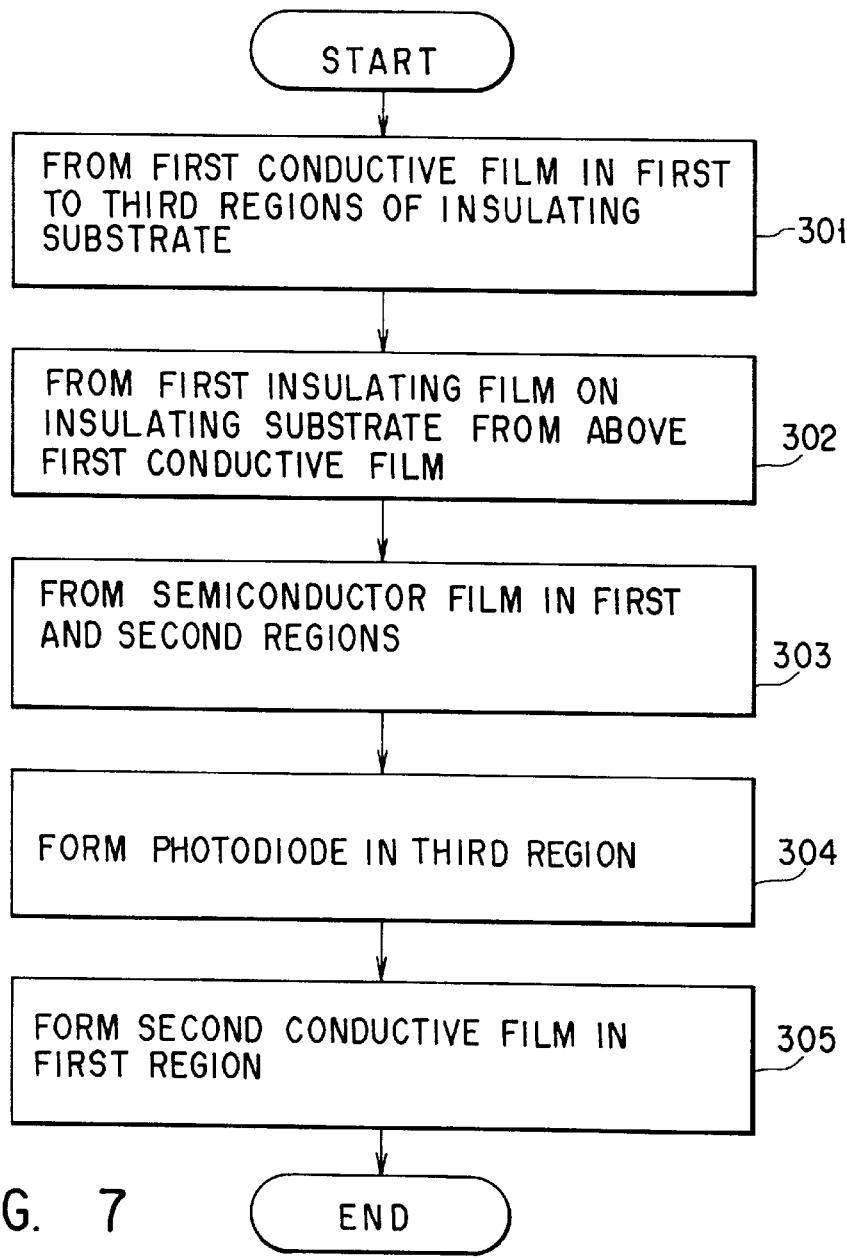
FIG. 7 is a flowchart showing a method of fabricating an image pick-up device according to the present invention.

With reference to FIG. 7, an image pick-up device according to the invention is fabricated by a method comprising a step 301 for forming a second conductive film in a first region, a second region and a third region of an insulating substrate, a step 302 for forming a first insulating film on the insulating substrate from above the first conductive film, a step 303 for forming a semiconductive film in the first region and the second region, a step 304 for forming a photo-diode in the third region, and a step 305 for forming a second conductive film in the first region. Specifically, first, a metal of a high melting point such as MoTa or MoW is deposited on a silicon or glass substrate 11, and patterned to form a gate electrode 12, a scanning line 13 and an auxiliary electrode 14.

Then, a gate insulating film 15 of silicon nitride (SiO$_X$) or silicon oxide (SiO$_X$) is deposited from above the gate electrode 12, the scanning line 13 and the auxiliary electrode 14. The gate insulating film 15 may be formed only of a silicon nitride film or a silicon oxide film or may be formed using a laminated layer of the films of the two materials.

Further, a protective film 17 for an etching stopper including an a-Si semiconductive film 16 and a SiO$_X$ is deposited and patterned.

In an image pick-up device according to this invention, the a-Si semiconductor film 16 and the protective film 17 for an etching stopper are formed not only on the portion to be formed with thin-film transistor but also at a crossing of the scanning line 13 and the signal line 18. Specifically, the crossing of the scanning line 13 and the signal line 18 is formed with a laminated structure of the scanning line 13, the a-Si film 16 and the etching stopper layer 17. Then, a source electrode 19 and a drain electrode 20 of the thin-film transistor 300 and the signal line 18 are formed of a metal such as aluminum.

Further, a pixel electrode 21 is formed of a Ti line metal or ITO, and a photodiode 22 constituting an amorphous silicon device (such as an i-(or n-)a-SiC:H/i-a-Si:H/p-a-SiC:H) is deposited as a photoelectric conversion device on the pixel electrode 21.

An X-ray imaging apparatus called a digital radiography apparatus is shown in FIG. 8. As shown in FIG. 8, a high-voltage generating section 62 generates electric power for driving an X-ray tube 51 by a control signal produced from a control section 63. The power supplied from the high-voltage generating section 62 to the X-ray tube 51 is roughly divided into the power used for fluorography by irradiation of a weak X-ray and the power used for radiography by irradiation of a strong X-ray. The power used for fluorography is not more than one hundredth of the power consumed for radiography. The X-ray emitted from the X-ray tube 51 is transmitted through a specimen 52 and enters an imaging plate 53 such as an intensifying screen for converting X-ray energy into optical energy. The amount of the X-ray entering the imaging plate 53 corresponds to the amount remaining without being absorbed by the specimen 52 and constitutes an X-ray image. This incident X-ray is converted into an analog electrical signal corresponding to the amount of X-ray at an image pick-up device (photoelectric conversion element) configured in a two-dimensional array in a detector 54. The analog signal thus converted into an electrical signal is converted into a digital signal at an A/D converter 57 in time sequence and stored in an image memory 58. The image memory 58 can store data of a single or several images sequentially in specified addresses in response to a control signal from the control section 63. A calculation processing section 59 retrieves the data from the image memory 58 and makes calculations, and returns the result to the image memory 58. The data of the image memory 58 thus calculated is converted into an analog signal by a D/A converter 60. This analog signal is displayed as an X-ray image on an image monitor 61.

Figure 6:
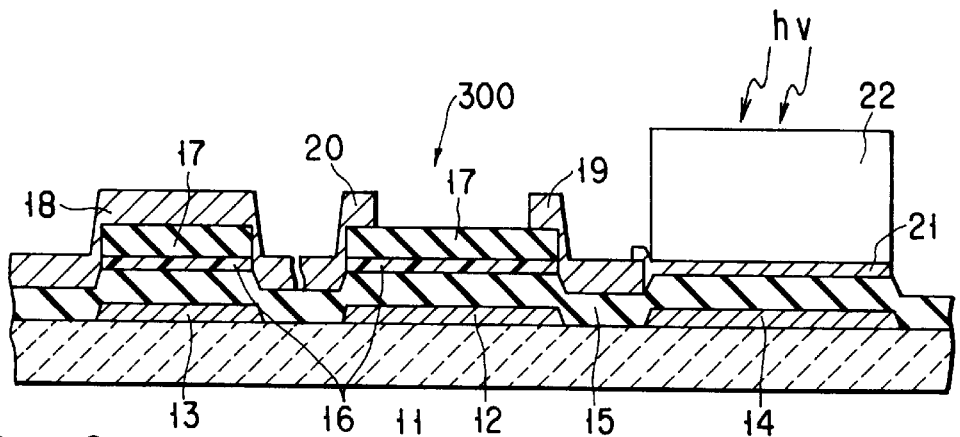
FIG. 6 is a sectional view taken in line VI—VI in FIG. 5.
Figure 9:
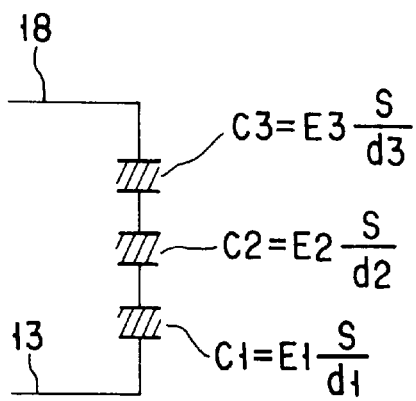
FIG. 9 is a model diagram showing a capacitance Cs-g of the crossing between the scanning line and the signal line.
Figure 10:
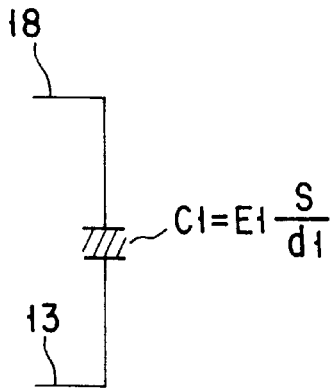
FIG. 10 is a model diagram showing the capacitance Cs-g of the crossing between the scanning line and the signal line.

The capacitance Cs-g formed at the crossing between the scanning line 13 and the signal line 18 in the structure of FIG. 6 will be explained. FIGS. 9 and 10 are diagrams showing a model of the capacitance Cs-g formed at the crossing between the scanning line 13 and the signal line 18. In the structure of FIG. 6, the capacitance Cs-g formed at the crossing of the scanning line 13 and the signal line 18 is configured of not only a capacitance $C_1$ due to a gate insulating film 15 but also capacitances $C_2$, $C_3$ formed by the a-Si film 16 and the protective film 17 acting as an etching stopper connected in series, as shown in FIG. 9. The capacitance formed at the crossing will be calculated using equation (1) for two cases: one (FIG. 10) in which only the gate insulating film 15 is deposited at the crossing of the scanning line 13 and the signal line 18 and the other (FIG. 9) in which an a-Si film 16 and a protective insulating film 17 constituting an etching stopper are deposited at the crossing of the scanning line 13 and the signal line 18.

As shown by equation (1), assume that the gate insulating film 15 has a thickness d1 of 300 nm and a dielectric constant $\epsilon 1$ of 5. Also, assume that the a-Si semiconductive film 16 has a thickness d2 of 50 nm and a dielectric constant $\epsilon 2$ of 11. Further, assume that the thickness d3 of the protective film 17 constituting an etching stopper is 300 nm and the dielectric constant $\epsilon$ thereof is 6, and that the area of the crossing of each insulating film is 100 $\mu m^2$ for both cases.

As shown in FIG. 10, the capacitance Cs-g of the crossing formed only of the gate insulating film 15 is 14.8 fF as shown in equation (1). In the case where a laminated structure of the gate insulating film 15, the a-Si semiconductive film 16 and the protective insulating film constituting the etching stopper 17 is formed at the crossing of the scanning line 13 and the signal line 18, on the other hand, the capacitances of the insulating films are connected in series and therefore the crossing capacitance Cs-g is reduced about by one half to 7.7 fF.

As a result, the noise component from the power supply of the scanning line drive circuit proportional to the crossing capacitance is reduced by about one half and the dynamic range is improved by about 6 dB.

Especially in the case where a high dynamic range is required as in the X-ray diagnostic apparatus as shown in FIG. 8, the image pick-up device according to the invention is very effectively applied.

Further, the X-ray dosage to the patient can be reduced or a very clear image can be produced as compared with the conventional apparatus with the same X-ray dosage.

Also, the structure in which the a-Si film 16 and the protective insulating film 17 as an etching stopper are deposited at the crossing of the signal line and the scanning line can be manufactured using the conventional TFT production process as described above. Consequently, noises can be reduced and an image pick-up device capable of producing a clear image can be manufactured without increasing the process complexity or the production cost.

The image pick-up device illustrated in FIG. 4 uses a thin-film transistor (TFT) with an a-Si (amorphous silicon) as a semiconductive film. As an alternative, however, a thin-film transistor can be formed using a semiconductor such as p-Si (polycrystal silicon) other than a-Si. Also, instead of the TFT of reverse stagger type used in the foregoing cases, a TFT of coplanar type can be used with equal effect.

(Embodiment 2)

Figure 11:
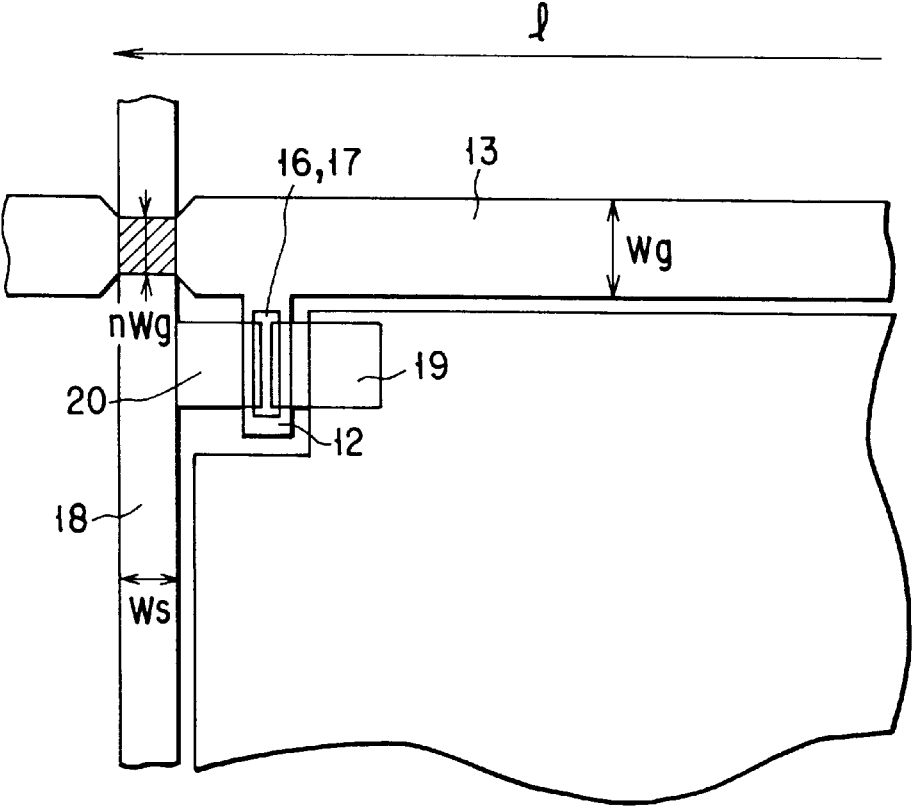
FIG. 11 is a diagram schematically showing another example of the structure of an image pick-up device according to the present invention.

Now, an embodiment will be explained in which the crossing capacitance is reduced by regulating the area of the crossing. Specifically, FIG. 11 is a diagram schematically showing another example of the structure of an image pick-up device according to the present invention, in which the crossing between the signal line and the scanning line is shown in enlarged form. The circuit configuration of this embodiment is similar to FIG. 4. In this embodiment, the same component parts as the corresponding parts of the image pick-up device in FIG. 4 are designated by the same reference numerals as in FIG. 4, respectively.

A gate electrode 12 of MoTa or MoW, a scanning line 13 and an auxiliary electrode 14 are formed on a substrate 11. A gate insulating film 15 is deposited integrally with the pixel. An s-Si film 16, a protective insulating film 17 as an etching stopper, a source electrode 19 and a drain electrode 20 are formed on the gate electrode 12. The drain electrode 20 is connected to the signal line 18, which in turn is connected to an amplifier through the scanning line 13. The source electrode 19 is connected to a pixel electrode 21, which in turn is configured of a layer of a photodiode 22 deposited on the pixel electrode 21.

The image pick-up device shown in FIG. 11 has a structure in which the scanning line 13 has a smaller width at the crossing with the signal line 18 than at the other portions thereof. The crossing capacitance Cs-g and a resistor R will be studied on the assumption that Ws is the width of the wiring of the signal line 18, Wg is the width of the portion of the scanning line 13 other than the portion thereof crossing the signal line 18, and n×Wg (0<n$\leq$1) is the width of the portion of the scanning line crossing the signal line 18.

In the case where the wiring width of the scanning line 13 is constant, i.e. in the case where the wiring width at the crossing is not reduced, the crossing capacitance $C_1$s-g and the resistance $R_1$ are given as $$C_1 s\text{-}g = (\epsilon \times Ws \times Wg)/D \tag{2}$$

$$R_1 = (\rho \times Ws)/(Wg \times d) \tag{3}$$

where D is the thickness of the insulating film, $\rho$ is the resistivity of the scanning line, 1 is the wiring length and d is the thickness of the scanning line.

Now, in the case where the wiring width of the crossing with the signal line 18 is regulated to a value of n×Wg (0<n$\leq$1), the crossing capacitance $C_2$s-g and the resistance $R_2$ are given as $$C_2 s\text{-}g = n \times \{(n \times \epsilon \times Ws \times Wg)/D\} \tag{4}$$

$$R_2 = (1/n) \times \{(\rho \times Ws)/(Wg \times d)\} \tag{5}$$

In the case where the time constant $\tau 2$ due to equations (4) and (5) is larger than the time constant $\tau 1$ due to equations (2) and (3), the on-resistance is increased or other problems such as a lower signal read rate result. In the example under consideration, however, no such problems are posed since the time constant $\tau 2$ due to equations (4) and (5) is equal to the time constant $\tau 1$ due to equations (2) and (3).

Also, as a result of reducing the wiring width according to equation (4), the crossing capacitance can be reduced by a factor of n×n (0<n$\leq$1) as compared with the capacitance expressed by equation (2). The noise due to power fluctuations of the scanning line drive circuit can be reduced for an increased dynamic range in the same manner as according to the method shown in FIG. 6 in which the crossing capacitance is reduced by forming a laminated structure at the crossing between the scanning line 13 and the signal line 18.

Especially, for an X-ray imaging diagnostic apparatus as shown in FIG. 8 requiring a high dynamic range, the image pick-up device according to the invention is effectively applicable. Further, the use of an image pick-up device according to the present invention in medical applications can contribute to a better medical diagnosis.

Although the foregoing description concerns the case in which the scanning line is used as a wiring crossing the signal line, the present invention is applicable with equal effect to the reduction in capacitance of the portion where the wiring other than the scanning line crosses the signal line.

(Embodiment 3)

Figure 12:
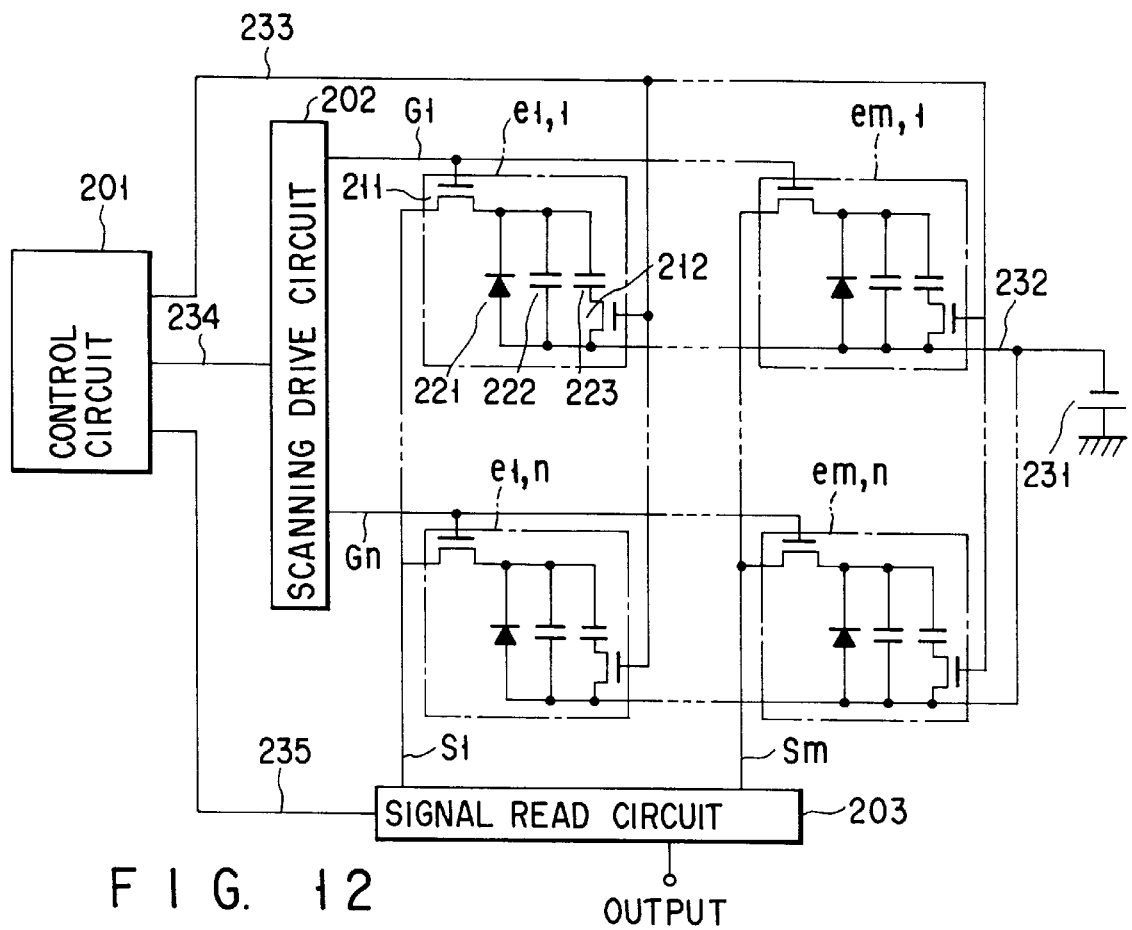
FIG. 12 is a block diagram showing the essential parts of an image pick-up device according to a third embodiment of the invention.

FIG. 12 is a block diagram showing the essential parts of an image pick-up device according to a third embodiment of the invention. According to this embodiment, the converter from X-ray to visible light is not described. Also, an application of the present embodiment will be explained with reference to an image pick-up device of an X-ray imaging apparatus. The invention, however, is not confined to a radiation diagnostic apparatus such as an X-ray imaging apparatus but can be applied with equal effect also to a photodetector or the like using a TFT array.

In FIG. 12, the image pick-up device comprises a control circuit 201, a scanning drive circuit 202, a signal read circuit 203, a plurality of TFTs (thin-film transistor) 211, a plurality of auxiliary capacitance switching TFTs 212, a plurality of photoelectric conversion films 221, a plurality of photoelectric conversion film-pixel electrode capacitors 222, a plurality of pixel electrode-auxiliary electrode capacitors 223, a power supply 231 and control signal lines 233, 234, 235.

The control circuit 201, which forms the nucleus of system control means, controls the read time and supplies a control signal to each block. The scanning drive circuit 202 has a plurality of output terminals corresponding to the gate drive lines, which output terminals produce gate drive signals sequentially to control the turn-on/off operation of each TFT 211. The signal read circuit 203, on the other hand, is for detecting the signal from each pixel and outputs by converting it into an image signal.

The image pick-up device further comprises gate drive lines (gate scanning signal wirings) G1 to Gn and signal lines (read wirings) S1 to Sm which are arranged in grids. The gate drive lines G1 to Gn are connected one-to-one to the output terminals of the scanning drive circuit 202 for driving the gate lines. As described above, the gate drive lines G1 to Gn are supplied with gate drive signals sequentially.

The rectangular areas defined by the gate drive lines G1 to Gn and the signal lines S1 to Sm constitute pixel areas in which pixels e1,1 to em,1 and e1,n to em,n, are formed respectively. Each of the pixels e1,1 to em,n includes a photoelectric conversion film-pixel electrode capacitor 222, a photoelectric conversion film 221, an a-Si TFT 211 for switching the photoelectric conversion film 221, a pixel electrode-auxiliary electrode capacitor 223 and a TFT 212 for switching the auxiliary capacitor. These component parts are supplied with a DC voltage from the power supply 223. Each pixel electrode-auxiliary electrode capacitance 223, however, is supplied with a DC voltage from the power supply 231 through the switching TFT 212.

One of the gate drive lines G1 to Gn corresponding to a given pixel is connected to the gate of the associated a-Si TFT 211 thereby to supply a gate drive signal to the associated gate drive line. As a result, the gate of the a-Si TFT 211 connected to the particular gate drive line is supplied with the same gate drive signal, so that the particular a-Si TFT 211 begins to conduct. The photoelectric conversion film 221 thus converts the light into an electrical signal. The charge corresponding to the incident light amount thus far charged in the photoelectric conversion film-pixel electrode capacitor 222 is output to the corresponding one of the signal lines S1 to Sm through the source-drain circuit of the a-Si TFT 211 that has conducted.

The pixel electrode-auxiliary electrode capacitor 223 is for controlling the time constant, and the charge thereof is controlled by turning on and off the auxiliary capacitor switching TFT 212 thereby to regulate the time constant according to the charge stored. A gate drive signal is supplied by a drive signal output from the control circuit 201 in accordance with the drive frequency of the image pick-up device, so that the on-off operation of the TFT 212 is controlled for switching the auxiliary capacitor.

The on-off control of each auxiliary capacitor switching TFT 212 is performed by the control circuit 201. Specifically, the control circuit 201 according to the present invention controls the TFT 212 in on state to lengthen the time constant as compared with the normal value in the radiography mode requiring a long drive time (long on-time of the TFT 211), and controls the TFT 212 in off state in the fluorography mode having a short drive time.

The apparatus according to this embodiment having the above-mentioned configuration has a plurality of pixels arranged in a matrix of m×n. When an optical image is formed on these pixels, the photoelectric conversion film 221 constituting each pixel generates a charge corresponding to the light amount of the optical image. The charge corresponding to the incident light amount converted by the photoelectric conversion film 221 is stored in the photoelectric conversion film-pixel electrode capacitor 222 having a capacitance Of $C_{pd}$.

According to the radiography or fluorography mode, the control circuit 201 outputs a required control signal to the above-mentioned component parts thereby to perform the following operations.

First, the gate signal of the TFT 212 is controlled by the control circuit 201 in such a manner as to turn on the TFT 212 in radiography mode and turn off the TFT 212 in fluorography mode.

Also, in response to a control signal from the control circuit 201, the scanning drive circuit 202 turns on (to H-level signal) the gate drive lines sequentially. This scanning drive circuit 202 has n terminals which are connected one-to-one to the gate drive lines G1 to Gn, respectively. Since the gate signals thus are supplied to the gate drive lines G1 to Gn sequentially, the gate drive lines G1 to Gn are turned on sequentially one by one. The TFT 211 with the gate thereof connected to a gate drive line thus turned on is kept on as long as the particular gate drive line is in on state. As a result, the charge of the particular pixel is transmitted to the corresponding one of the signal lines S1 to Sm through the TFT 211 turned on.

Upon receipt of a control signal from the control circuit 201, on the other hand, the signal read circuit 203 scans and reads the output signal from the signal lines S1 to Sm one by one sequentially each for a predetermined length of time. The signal thus read is output from the output terminal of the signal read circuit 203.

Specifically, the signal read circuit 203, which is connected to m signals lines S1 to Sm, scans the signals lines S1 to Sm one by one sequentially and reads the output signal from the associated signal lines each for a predetermined length of time. The charge from each corresponding pixel thus is stored and output as an image signal.

In this way, the gate drive lines G1 to Gn and the signal lines S1 to Sm are sequentially switched and driven each for a predetermined length of time. The pixels arranged in a matrix thus are accessed sequentially by X-Y scanning, so that the charges stored in the pixels are read out in the same order as the pixels are arranged.

The control circuit 201 decides on radiography or fluorography mode, and supplies an appropriate control signal to the scanning drive circuit 202 and the signal read circuit 203.

As an example, the signals supplied to the scanning drive circuit 202 are shown in FIGS. 11A and 11B. FIG. 11A shows a control signal for radiography, and FIG. 11B shows a control signal for fluorography. Symbol CPV designates a clock signal for the scanning drive circuit, and STV a start signal. The control circuit 201 generates a start signal STV, which is applied to the scanning drive circuit 202 and the signal read circuit 203. The instant the start signal STV is applied to the scanning drive circuit 202 and the signal read circuit 203, these circuits are triggered and perform a predetermined operation for scanning the TFT array. This predetermined operation is performed each time of triggering.

In radiography mode, only a single image is picked up, and therefore, the start signal STV is output only once. Also, the clock signal CPV is required to retrieve an image in about one second. A frequency sufficient for this operation is about 1 kHz for a pixel configuration of, say, 1000×1000.

In fluorography mode, on the other hand, about 30 images are required to be retrieved per second. Therefore, the start signal STV is generated to repeat the operations at intervals of about one thirtieth of a second. Consequently, the start signal STV is output at a high speed (about 30 kHz) in fluorography mode.

The image signal can be read by applying a H level signal to the gate drive line and turning on the TFT 211. In fluorography mode, as described above, the clock signal CPV of about 30 kHz is generated by the scanning drive circuit 202 and applied distributively one clock pulse to each of the output terminals of the scanning drive circuit 202. In this way, the gate drive lines G1 to Gm are driven sequentially and the TFTs 211 of the pixels connected to the respective drive lines thus driven are turned on. The charge that has been stored in the respective pixels is sent to the signal read circuit 203.

As soon as the gate drive ling G1 is driven, for example, the TFTs of the pixels e1,1 to em,n are turned on, and the charges that have been stored are moved to the signal read circuit 203. In the process, the time constant τ can be given as $$\tau = RT \times C_{pix}$$

where RT is the on-resistance of the TFTs and $C_{pix}$ (=$C_{pd}$+$C_{cs}$) is the pixel capacitance.

$C_{cs}$ is the capacitance held by the pixel electrode-auxiliary electrode capacitor 223, which is connected to the auxiliary electrode switching TFT 212 to turn on/off the TFT 212 in accordance with the drive frequency. When the TFT 212 is in on state, the auxiliary capacitor $C_{cs}$ is connected to the power supply 231 and a DC voltage is supplied from the power supply 231. As a result, the charge is stored in the auxiliary capacitor $C_{cs}$. The time constant τ of the pixel under this condition is expressed as $$\tau = RT \times (C_{pd} + C_{cs})$$

In the case where the TFT 212 is in off state, on the other hand, the $C_{cs}$ is in floating state and the time constant τ of the pixel is given as $$\tau = RT \times C_{pd}$$

In other words, the time constant τ of the pixel can be varied between $RT \times C_{pd}$ and $RT \times C_{pd} + C_{cs}$ depending on whether $C_{cs}$ is kept floating or connected. It is thus possible to regulate the time constant by the amount of $C_{cs}$.

In the case where the charge stored in a pixel is read out, the read time required (drive time) is determined by the time constant of the pixel capacitor and the on-resistance of the TFT used for switching operation. A read time short as compared with the time constant, however, makes it impossible to sufficiently read the charge stored in the pixel and causes an error (noise) of the read signal and the stored charge. This read error is one of noises unique to the TFT array. In the case where the read time (drive time) is short, therefore, it is possible to suppress the read error by making the time constant longer than when the read time is long.

In view of this, according to this invention, the control circuit 201 is used to turn on the TFT 212 in the radiography mode associated with a long drive time (on-time of the TFT 211) thereby to lengthen the time constant as compared to under normal conditions. In the fluorography mode short in drive time, in contrast, the TFT 212 is turned off to set the time constant to a normal value. In this way, the read error can be maintained constant. Further, the same TFT 211 is used for either mode, and therefore the leak current is also constant.

As described above, even if the drive time (read time) changes between radiography and fluorography modes, the time constant is controlled by the on-off control operation of the TFT 212 by an amount covering the elements corresponding to the capacitance $C_{cs}$ of the pixel electrode-auxiliary electrode capacitor 23, thereby making it possible to appropriately control the read error and the leak current making up noises unique to the TFT array.

FIG. 14 shows an example of a plan view showing a pixel according to the present invention. In FIG. 14, those component parts identical to the corresponding parts in FIG. 12 are designated by the same reference numerals, respectively, and will not be described in detail. A TFT 211, a signal line S, a scanning line G and a pixel electrode 224 are configured the same way as an ordinary TFT-LCD (liquid crystal display). An auxiliary electrode 225 is configured under the pixel electrode 224 with an insulating film held therebetween, and an auxiliary capacitor 223 is formed between the auxiliary electrode 225 and the pixel electrode 224. Though not shown, the photoelectric conversion film 221 covers the pixel electrode, and a photoelectric conversion film-pixel electrode capacitor 222 is formed between the pixel electrode 224 and the photoelectric conversion film 221.

The auxiliary electrode 225 is connected to the drain electrode of the auxiliary capacitor switching TFT 212, and the source electrode of the TFT 212 is connected to a bias line 232. Further, the gate electrode of the TFT 212 is connected to a control signal line 233. In radiography mode, the control signal line 233 is supplied with a H level signal, so that the TFT 212 is turned on thereby to fix the potential of the auxiliary electrode 225 to Vbias of the power supply 231. As a result, a pixel electrode-auxiliary electrode capacitor 223 having a capacitance value of $C_{cs}$ is inserted in the circuit. In fluorography mode, on the other hand, the control signal line 233 is supplied with a L level signal and the TFT 212 is turned off. At the same time, the pixel electrode-auxiliary electrode capacitor 223 is floated, and therefore the charge remains unchanged from immediately before turn-off. Therefore, the charge is stored only by the photoelectric conversion film-pixel electrode capacitor 222 having a capacitance value of $C_{pd}$.

In this way, the time constant can be switched according to radiography or fluorography mode, so that the read error can be suppressed in spite of the mode switching.

Although the present embodiment uses only one auxiliary capacitor $C_{pd}$ in the form of the pixel electrode-auxiliary electrode capacitor 223 as shown, the auxiliary capacitor can be divided into several units, each connected to a TFT for switching control. In such a case, the integral time constant can be regulated more finely.

Figure 13A:
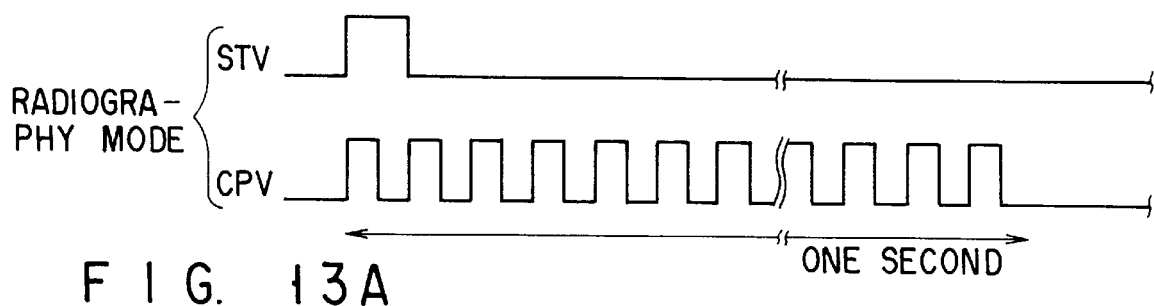
FIGS. 13A and 13B are diagrams showing example control signals supplied from a control circuit to a scanning line drive circuit of a system according to the invention.
Figure 13B:
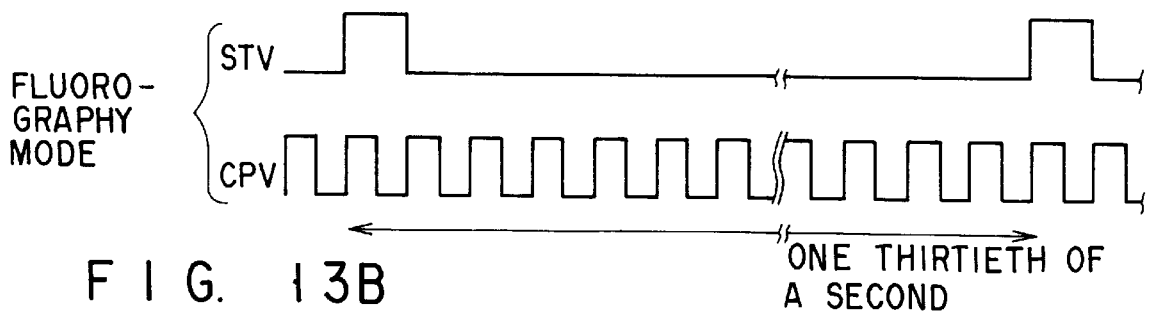

Explanation will be made about a specific circuit configuration of the control circuit 201, the scanning drive circuit 202 and the signal read circuit 203. FIG. 15 shows a configuration of the control circuit 201. The control circuit 201 includes a radiography-fluorography mode change-over switch 241, timing adjusting counters 242, 244, drive signal generating circuits 243, 245, a selector 246 and an auxiliary capacitor switching circuit 247. The timing adjusting counter 242 is for generating a timing signal at a timing for radiography, and the drive signal generating circuit 243 generates a drive signal in response to the signal from the timing adjusting counter 242. The timing adjusting counter 242 and the drive signal generating circuit 243 combine to generate a radiography control signal (a spontaneous start signal STV and a clock signal CPV of predetermined frequency) as shown in FIG. 13A. Also, the timing adjusting counter 244 repeatedly generates a timing signal at a timing for fluorography, and the drive signal 5 generating circuit 245 generates a drive signal in response to the signal from the timing adjusting counter 244. The timing adjusting counter 244 and the drive signal generating circuit 245 combine to generate a fluorography control signal (a start signal STV of a repetitive frequency and a clock signal CPV of high frequency) as shown in FIG. 13B.

The change-over switch 241 is for performing the input operation for setting the mode to radiography or fluorography, and the selector 246 outputs a control signal for radiography or fluorography according to the signal from the change-over switch 241. Also, the auxiliary capacitor switching circuit 247 is configured to generate a signal for controlling the gate of the TFT 212 in such a manner as to turn off the TFT 212 in radiography mode and turn it on in fluorography mode in accordance with the setting operation by the change-over switch 241.

Figure 16:
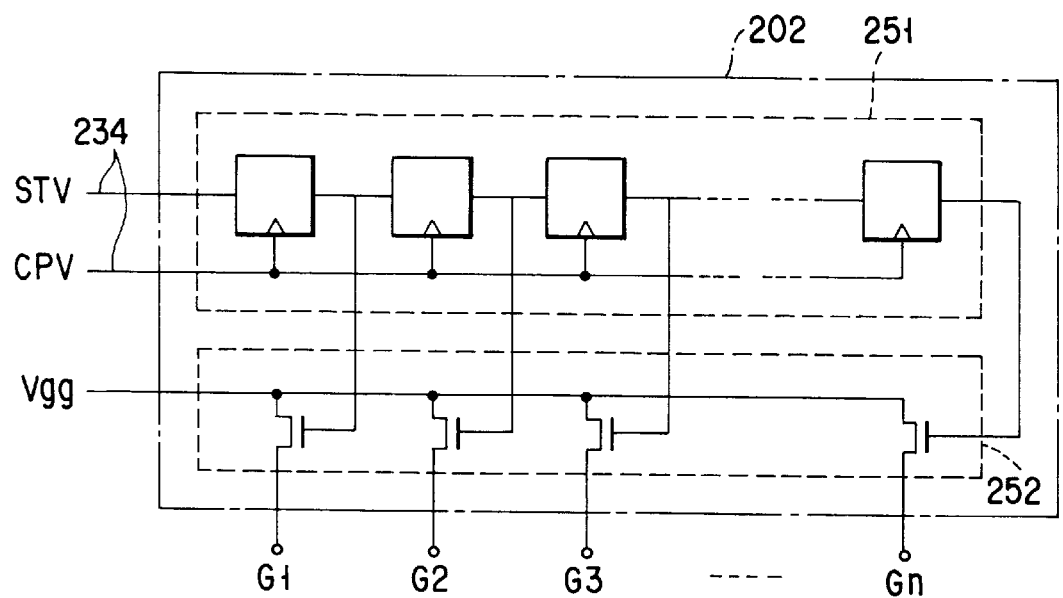
FIG. 16 is a diagram showing an example of the scanning line drive circuit of a system according to the invention.

FIG. 16 shows a configuration of the scanning drive circuit 202. The scanning drive circuit 202 has a structure similar to an ordinary TFT-LCD, and includes a shift register 251 and an analog switch 252. The shift register 251 performs the shifting operation each time of receipt of the clock signal CPV. In response to the clock signal CPV and the start signal STV from the control circuit 201, the shift register 251 shifts the start signal STV sequentially at the timing of the leading edge of the clock thereby to turn on the analog switch 252.

The analog switch 252 is configured with a plurality of transistors corresponding to the respective orders of digits of the shift register 251, and applies the output thereof to a corresponding one of the gate drive lines G1 to Gn. In the case where a corresponding bit of the shift register 251 is H, for example, the analog switch 252 produces an H signal which constitutes a gate drive signal. In other words, when the analog switch 252 is in on state, an on-potential Vcc is supplied through a transistor to a corresponding one of the gate drive lines G1 to Gn.

Figure 17A:
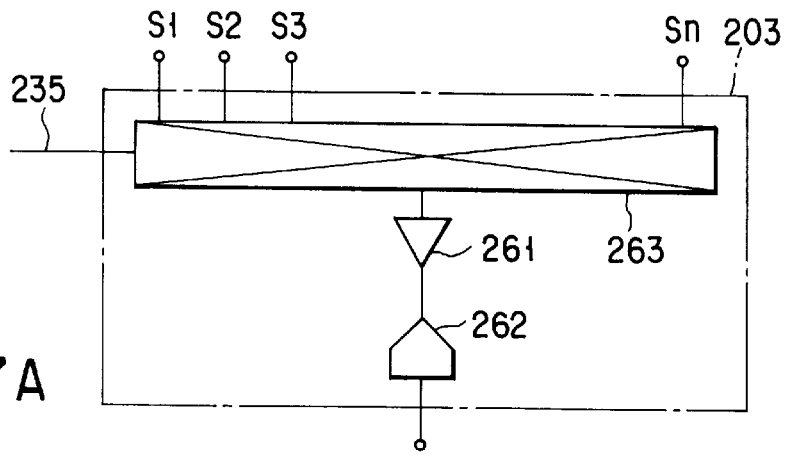
FIGS. 17A and 17B are diagrams showing an example a signal read circuit of a system according to the invention.
Figure 17B:
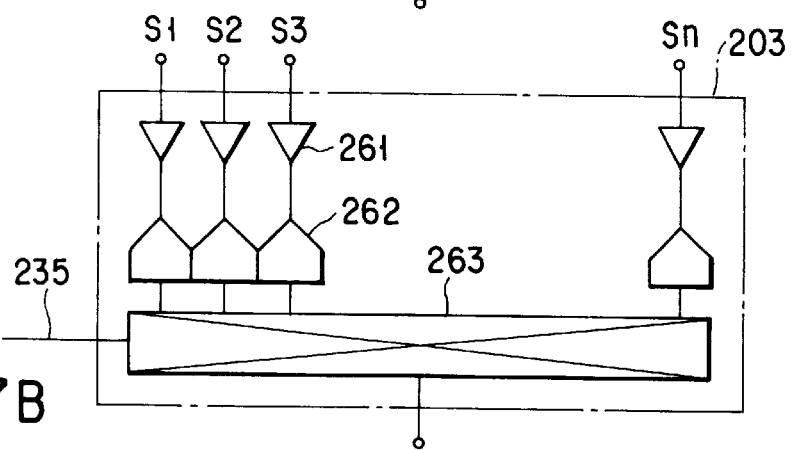

A configuration of the signal read circuit 203 is shown in FIGS. 17A and 17B. FIG. 17A shows a configuration connected to an amplifier 261 for each set of the signal lines S1 to Sm to process the signals in parallel. FIG. 17B shows a configuration having the last stage thereof connected to an amplifier to process the signal serially. Though not shown, other methods are available for connecting an amplifier for each several signal lines.

The signal read circuit 203 includes an amplifier 261, an A/D converter 262 and a multiplexer 263. The amplifier 261 fetches the charge of each pixel through the signal lines S1 to Sm, amplifies the voltage level thereof and outputs the resulting signal. The A/D converter 262 converts the analog signal output of the amplifier 261 into a digital signal. Since the quantization error of the A/D converter 262 also affects the image quality, the A/D converter has desirably a larger capacity in terms of the number of bits (12 bits or more, for instance).

As described above, according to the third embodiment, there is provided an image pick-up device comprising a plurality of pixel electrodes each including a photoelectric conversion film for converting the incident light into an electrical signal of a corresponding amount, a pixel capacitor for storing the output of the photoelectric conversion film and a thin-film transistor (TFT) for reading the stored charge of the pixel capacitor, and means for controlling the switching operation of each thin-film transistor (TFT), sequentially reading the stored charge of each pixel capacitor and producing an image signal, wherein each pixel includes an auxiliary capacitor for switching the time constant, and an operating switch for controlling the connection of the auxiliary capacitor to the pixel capacitor, the connection or disconnection of the auxiliary capacitor is controlled in accordance with the signal read time of each pixel by controlling the operating switch, and thus the time constant is controlled for reading out the stored charge of each pixel capacitor through the TFT. The read error affecting the image quality depends on the magnitude of the time constant for a short read time. The time constant for determining the read error, in turn, depends on the resistance values of the TFT and the pixel capacitor. Therefore, the time constant can be changed in accordance with the read time (mode) by controlling the connection or disconnection of the auxiliary capacitor to the circuit and thereby controlling the time constant. Consequently, the read error can be controlled, and the same leak current can be maintained since the charge stored in the pixel capacitor is read out using the same TFT for different modes.

Although the foregoing embodiment uses the auxiliary capacitor included in each pixel for switching the time constant, the time constant can be switched according to the mode also without using the auxiliary capacitor. An example is described below as a fourth embodiment.

(Embodiment 4)

According to the fourth embodiment, three levels of the gate drive signal for on-off control of the TFT 211 including two high potential levels and one low potential level are used to select two drive levels of the TFT 211 in on state, thereby switching the time constant. This embodiment will be described in detail below.

Figure 18:
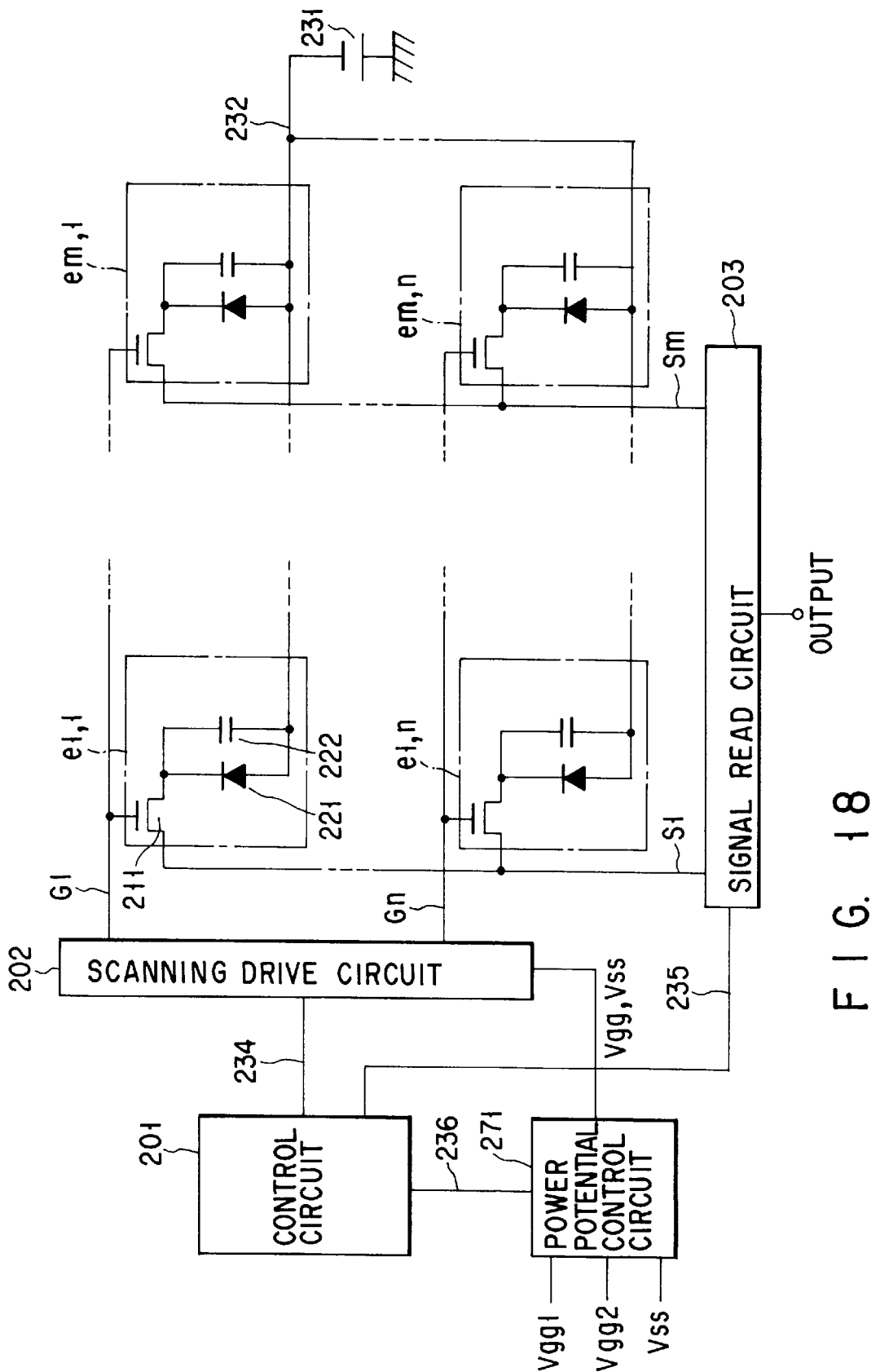
FIG. 18 is a block diagram showing the essential parts of an image pick-up device according to a fourth embodiment of the invention.

FIG. 18 is a block diagram showing the essential parts of an image pick-up device according to the fourth embodiment of the invention. In FIG. 18, those component parts similar to or identical to the corresponding parts in FIG. 12 are designated by the same reference numerals, respectively, and will not be described in detail. According to this embodiment, the X-ray source and the X-ray-visible light conversion section are not shown. Also, in spite of the fact that the X-ray diagnostic apparatus is described as an example, the present invention is applicable also to image pick-up devices in general using a TFT array with equal effect. Also, though not shown in FIG. 18, the present embodiment can be used also for the method of controlling the pixel capacitor described in the first embodiment. The feature of this embodiment lies in that the pixel electrode-auxiliary electrode capacitor 223 ($C_{cs}$) and the auxiliary capacitor switching TFT 212 are discarded, and replaced by a circuit 271 for controlling the potential of the output from the scanning drive circuit 202.

The output of the scanning drive circuit 202 normally assumes one of two levels Vgh (level H) and Vgl (level L) for controlling the on-off state of the TFT 211. In the process, the on-resistance of the TFT 211 is determined by the high-level output Vgh. According to this invention, the potential control circuit 271 is supplied with two high voltages Vgg1 and Vgg2 as high-level signals, and one low voltage Vss corresponding to low level L. The potential representing the H level for turning on the TFT 211 is switched between Vgg1 and Vgg2 by the drive frequency thereby to change the on-resistance of the TFT 211 and adjust the time constant to an optimum value. This switching control is performed by the control circuit 1 in accordance with the radiography and fluorography mode.

This operation can maintain a constant read error regardless of the drive frequency. Also, since the same TFT is used for different modes, the leak current always remains in the same state, thereby reducing the effect of the noises due to the read error and the leak current.

A specific configuration of the potential control circuit 271 is shown in FIG. 19. The potential control circuit 271 is supplied with two types of high voltages Vgh (=Vgg1) and Vgl (=Vgg2) representing H level, which are switched by the switching circuit 271a to produce Vgg in response to the signal 236 of the control circuit 201. Vss is level L and normally a zero potential (ground potential). The voltages Vss and Vgg are applied to the scanning drive circuit 202.

With this configuration, the high-level power supply Vgg supplied to the scanning drive circuit 202 is switched by the switching circuit 271a in response to the signal from the control circuit 201. With the configuration in which the scanning drive circuit 202 receives Vgg and Vss and the output signal assumes the level of Vgg or Vss, the Vgg equals Vgh when the output is at high level.

As described above, normally, the high-level signal output of the scanning drive circuit 202 is Vgg=Vgh. By switching the power supply Vgg between Vgg1 (=Vgh) and Vgg2 (=Vgl), therefore, the H output can be changed between Vgh and Vgl. As a result, the time constant can be switched.

The description of the foregoing embodiments concerns an image pick-up device comprising an array of pixels each including a photoelectric conversion film, a pixel electrode and a switching TFT, constituting a system mainly using an a-Si TFT as an object of suppressing the read error and the leak current. The invention, however, is not limited to the a-Si TFT, but may be equally effective if a polysilicon TFT is used. Also, although a two-dimensional image pick-up device is assumed in the foregoing description of the invention, a one-dimensional image pick-up device (photo detector) having a linear pixel arrangement can also find an application as a large-sized line sensor.

(Embodiment 5)

An image pick-up device according to a fifth embodiment of the invention will be described below with reference to FIG. 20. Specifically, FIG. 20 shows only one pixel (pixel e2,2") of the image pick-up device. The pixel e2,2" includes a photodiode 140, a pixel capacitor 142, an a-Si TFT 144, an auxiliary capacitor 161 and a switching element 162 adapted to be turned on/off by a control signal supplied from a control terminal 163. Also, the crossing between the signal line and the scanning line is formed with a capacitor 160. The control signal applied to the control terminal 163 corresponds to radiography or fluorography mode.

The conventional pixel e2,2 includes a photodiode 140, a pixel capacitor 142 and an a-Si TFT 144. According to this embodiment, in contrast, the auxiliary capacitor 161, the switching element 162 and the crossing capacitor 160 are added. The crossing capacitor 160 is similar to the one included in the embodiment (first embodiment) shown in FIGS. 4 to 6. Also, the auxiliary capacitor 161 and the switching element 162 are similar to those included in the embodiment (third embodiment) of FIGS. 12 to 17A and 17B. According to this embodiment, therefore, like in the first embodiment, the crossing capacitance can be substantially reduced, while at the same time changing the time constant in accordance with the radiography or fluorography mode as in the third embodiment. In addition to the combination of the first and third embodiments described above, a combination is of course possible between the first and fourth embodiments, between the second and third embodiments, or between the second and fourth embodiments with equal effect.

As described above, the image pick-up device according to the invention has a small noise and can produce a clear image. Also, according to the present invention, the dynamic range of the image pick-up device can be enlarged. Especially, the image pick-up device according to the invention, which can produce a clear image with a low noise and a large dynamic range, can find an application as an image pick-up device requiring a high accuracy and a high reliability such as a medical X-ray diagnostic apparatus.

Further, the X-ray dosage prescribed to the patients can be reduced, and a much clearer image can be taken than the conventional apparatus with the same dosage.

Furthermore, the invention provides an image pick-up device capable of producing a clear image with a low noise and a large dynamic range without complicating the fabrication process or without increasing the production cost.

Still another advantage of the image pick-up device according to the invention, which comprises an array of pixels each including a photoelectric conversion film, a pixel capacitor and a switching TFT, resides in that provision of means for switching the time constant minimizes the read error and the leak current constituting errors unique to the TFT array even in the case where the device is operated with two or more drive times such as for radiography and fluorography of the X-ray diagnostic apparatus. In this way, an image pick-up device is provided with an improved image quality applicable to medical equipment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. An image pick-up device comprising:
   an insulating substrate;
   a plurality of photoelectric conversion circuits formed on said insulating substrate;

a plurality of thin-film transistors formed on said insulating substrate and each including a first portion of a lamination of an insulating film and a semiconductor film connected to a respective of said plurality of photoelectric conversion circuits;

a plurality of signal lines formed on said insulating substrate for reading out voltages stored in respective of said plurality of photoelectric conversion circuits through respective of said plurality of thin-film transistors;

a plurality of wirings formed on said insulating substrate; and wherein a respective of said plurality of wirings crosses a respective of said plurality of signal lines at a crossing such that a second portion of the lamination of said insulating film and semiconductor film is formed at said crossing between the respective wiring and signal line.

2. An image pick-up device according to claim 1, wherein each of said wirings is a scanning line for driving a respective of said plurality of thin-film transistors.

3. An image pick-up device according to claim 1, wherein a respective of said photoelectric conversion circuits and a respective of said thin-film transistors make up one pixel, and a plurality of said pixels are formed in an array on said insulating substrate.

4. An image pick-up device according to claim 1, wherein each of said plurality of photoelectric conversion circuits includes a photoelectric conversion film and a pixel capacitor defining an integral time constant, and said image pick-up device further comprising means for changing the integral time constant defined by each of said photoelectric conversion film and said pixel capacitor.

5. An image pick-up device comprising:
an insulating substrate;
a plurality of pixels formed on the insulating substrate, each pixel including:
   a photoelectric conversion circuit formed on said insulating substrate;
   a thin-film transistor formed on said insulating substrate and including a first portion of a lamination of an insulating film and a semiconductor film connected to said photoelectric conversion circuit;
   a signal line formed on said insulating substrate for reading out a voltage stored in said photoelectric conversion circuit through said thin-film transistor;
   a wiring formed on said insulating substrate to cross the signal line at a crossing; and
   wherein a second portion of the lamination is formed between the signal line and the wiring at the crossing.

6. An image pick-up device according to claim 5, wherein said wiring is a scanning line for driving said thin-film transistor.

7. An image pick-up device according to claim 5, wherein said plurality of pixels are formed in an array on said insulating substrate.

8. An image pick-up device according to claim 5, wherein said photoelectric conversion circuit includes a photoelectric conversion film and a pixel capacitor defining an integral time constant, and said image pick-up device further comprising means for changing the integral time constant defined by said photoelectric conversion film and said pixel capacitor.

* * * * *